United States Patent [19]

Maier et al.

[11] Patent Number: 4,661,168

[45] Date of Patent: Apr. 28, 1987

[54] METHOD OF INTEGRATING INFRARED SENSITIVE IMAGE RECORDING ELEMENT WITH CCD ON SAME SUBSTRATE

[75] Inventors: Horst Maier, Heilbronn; Max Schulz, Uttenreuth, both of Fed. Rep. of Germany

[73] Assignees: Licentia Patent-Verwaltungs-GmbH, Frankfurt am Main; Telefunken electronic GmbH, Heilbronn, both of Fed. Rep. of Germany

[21] Appl. No.: 802,601

[22] Filed: Nov. 25, 1985

Related U.S. Application Data

[62] Division of Ser. No. 435,751, Oct. 21, 1982.

[30] Foreign Application Priority Data

Jan. 14, 1982 [DE] Fed. Rep. of Germany ....... 3200853

[51] Int. Cl.$^4$ .................. H01L 21/265; H01L 29/78; G11C 19/28
[52] U.S. Cl. ....................................... 148/1.5; 29/571; 29/572; 29/574; 29/576 B; 148/175; 148/DIG. 82; 148/DIG. 94; 357/24
[58] Field of Search ................... 148/1.5, 175; 29/571, 29/572, 574, 576 B; 357/24

[56] References Cited

U.S. PATENT DOCUMENTS

| | | | |
|---|---|---|---|
| 3,808,435 | 4/1974 | Bate et al. | 357/24 LR |
| 3,883,437 | 5/1975 | Nummedal et al. | 250/332 |
| 4,093,872 | 6/1978 | Hartman et al. | 357/24 |
| 4,093,957 | 6/1978 | King et al. | 357/24 |
| 4,188,709 | 2/1980 | Lorenze, Jr. et al. | |
| 4,197,469 | 4/1980 | Cheung | 357/24 LR |
| 4,197,633 | 4/1980 | Lorenze, Jr. et al. | |
| 4,206,470 | 6/1980 | White | 357/30 |
| 4,286,278 | 8/1981 | Lorenze, Jr. et al. | 357/30 |
| 4,290,844 | 9/1981 | Rotolante et al. | 148/1.5 |
| 4,301,591 | 11/1981 | Withers | 29/572 |
| 4,304,624 | 12/1981 | Carson et al. | 29/572 |
| 4,376,659 | 3/1983 | Castro | 148/1.5 |
| 4,377,904 | 3/1983 | Chapman et al. | 29/578 |
| 4,411,732 | 10/1983 | Wotherspoon | 29/572 |
| 4,559,695 | 12/1985 | Baker | 29/572 |

FOREIGN PATENT DOCUMENTS

| | | |
|---|---|---|
| 0033414 | 8/1981 | European Pat. Off. |
| 3043913 | 6/1981 | Fed. Rep. of Germany |
| 2484705 | 12/1981 | France |

OTHER PUBLICATIONS

Walter L. Brown, "Superfast Annealing", *IEEE Spectrum*, Apr. 1981, pp. 50–54.

G. Bahir et al, "Cw $CO_2$ and Ruby Laser Annealing of Ion–Implanted $Hg_{1-x}Cd_xTe$", *Applied Physics Letters*, vol. 39, No. 9, Nov. 1st, 1981, pp. 730–732.

R. H. Cornely et al, "Effects of Annealing in Hg Vapor on the Properties of rf-Sputtered Thin Films of $(Hg_{1-x}Cd_x)Te$", *Journal Vacuum Science Technology*, vol. 18, No. 2, Mar., 1981, pp. 190–194.

J. T. Longo, et al., "Infrared Focal Planes in Intrinsic Semiconductors", *IEEE Transactions on Electron Devices*, vol. 25, (1978) pp. 213 to 232.

(List continued on next page.)

*Primary Examiner*—Upendra Roy
*Attorney, Agent, or Firm*—Spencer & Frank

[57] ABSTRACT

A method of producing a semiconductor device including an image recording unit composed of a plurality of separated detector mosaic regions of infrared sensitive monocrystalline compound semiconductor material disposed on an insulating layer on a surface of a semiconductor body containing an integrated circuit which functions as a readout device for the image recording body, wherein: the plurality of mosaic regions are formed by initially depositing a layer of the compound semiconductor material in polycrystalline form directly onto the surface of the insulating layer, and subsequently recrystallizing the polycrystalline material into monocrystalline form by irradiation of the polycrystalline material with a focused high energy light beam to melt the semiconductor material, followed by resolidification.

20 Claims, 2 Drawing Figures

OTHER PUBLICATIONS

A. J. Steckl, et al., "Direct Injection Readout of the p-n PbS-Si Heterojunction Detector", *American Institute of Physics*, (1979) pp. 537 to 539.

D. D. Buss, et al., "Infrared Monolithic Hg Cd Te Ir CCD Focal Plane Technology", Intern. Electron. Devices Meeting, Wash., D.C., 1978.

N. M. Johnson, et al., "Properties of Patterned and CW Laser-Crystallized Silicon Films on Amorphous Substrates", *Proceedings INFOS-Conference*, Erlangen (1981).

Andrews in IEEE—Electron Device Meeting, Wash., D.C., USA (1978) pp. 505-509.

Matsuura et al., Jap. Jour. Appl. Phys., 21 (Jan. 1982) 23.

Norris et al., Radiation Effects Letts., 58 (1981) 115.

Fusisawa, Jap. Jour. Appl. Phys., 19 (1980) 2137.

Bontemps et al., "Laser Annealing of Pb-Implanted InSb", Laser & Electron Beam Processing of Materials, *Academic Press*, C. W. White, N.Y., N.Y., 1980, pp. 378-384.

Andrews, "Hybrid Infrared Imaging Arrays", Conf. 1978, IEDM Wash., D.C., 4-6, Dec. 1978, pp. 505-509.

Hoendervoogt et al., "Hybrid InSb Focal Plane Array Fabrication", Conf. 1978, IEDM Wash., D.C., 4-6, Dec. 1978, pp. 510-512.

METHOD OF INTEGRATING INFRARED SENSITIVE IMAGE RECORDING ELEMENT WITH CCD ON SAME SUBSTRATE

This application is a division of application Ser. No. 435,751, filed Oct. 21, 1982.

BACKGROUND OF THE INVENTION

This invention relates to a semiconductor arrangement with an image recording unit comprising an infra-red-sensitive compound semiconductor material and having an integrated semiconductor circuit as a read out unit, the two units being connected both electrically and mechanically and a method for manufacturing this semi conductor arrangement.

Infra-red-Quantum-Detectors are produced from semiconductor material in which the radiation interacts with electrons from the lattice bond. This interaction may take the form of ionisation of donors or acceptors (extrinsic detectors) or stimulation of electrons from the valence band into the conduction band (intrinsic detectors). In-doped silicon, for example, for the wave length range betwen 3 and 5 $\mu$m and Ga-doped silicon for the wave length range of 8 to 12 $\mu$m belong to the class known as extrinsic detectors. Mercury/Cadmium/Telluride for example belongs to the class known as intrinsic detectors and is suitable, depending on its composition (the concentration of cadmium/telluride) for the wave length range between 3 and 5 $\mu$m and 18 and 14 $\mu$m.

In addition, intrinsic detectors have the advantage that they can be operated at relatively high temperatures, for example at temperatures greater than or equal to that of liquid nitrogen; and that because of their higher absorption coefficient they can be made thinner, for example, less than or equal to 10 $\mu$m, and therefore have more sharply contoured sensitive surfaces.

On the other hand, extrinsic detectors based on silicon have the advantage that part of the signal processing can be integrated simply into the detector mosaic and the number of signal output lines can be reduced by means of charge shift registers (CCD) or charge injection (CID).

If the infra-red detector is to be used to display an image without an optical scanning system, then it is desirable to have a high density of detector elements, for example more than 64×64 elements on the focal plane. In this case integration of the read-out circuits is indispensable. In order to maintain the advantages of the intrinsic detector material HgCdTe, two methods have been tried.

The first is to integrate the read-out unit into the HgCdTe-material. This has been described for example in "Infrared Monolithic HgCdTe IR CCD Focal Plane Technology", D. D. Buss et al, Intern. Electron. Devices Meeting, Washington DC, 1978.

In the case of highly integrated circuits in narrow band semiconductors such as HgCdTe, considerable physical and technological difficulties are involved.

The second method consists of connecting HgCdTe-detectors by means of a simultaneous soldering process to Si-readout circuits. A metalic contact on the HgCdTe-body and a corresponding contact on the Si-circuit are associated with each detector element in the HgCdTe-semiconductor body which includes the whole of the detector. The two semiconductor bodies are combined in similar manner to flip chip techniques and the associated contacts are soldered together. This is described for example in: "Infrared Focal Planes in Intrinsic Semiconductors", J. T. Longo et al, IEEE Trans. Electr. Dev. ED 25, page 213 232 (1978).

The output of this type of simultaneous soldering process is therefore limited. In addition there are considerable technological difficulties with this method.

SUMMARY OF THE INVENTION

It is an object of the present invention to eliminate the disadvantages which occur in the two known methods which have been mentioned and to a provide semiconductor arrangement and a method for its manufacture in which the output can be large and the technological difficulties are small.

According to a first aspect of the invention, there is provided a semiconductor arrangement comprising a semiconductor body, an insulating layer covering at least part of said semiconductor body, a plurality of separate mosaic regions directly disposed on said insulating layer and formed of Infrared sensitive compound semiconductor materials with at least one pn-junction, an integrated semiconductor circuit on said semiconductor body and connection means for electrically connecting each said mosaic structure to a circuit within said integrated circuit.

Further according to this aspect of the invention, there is provided a semiconductor arrangement with an image recording unit comprising an infra-red sensitive compound semiconductor material and having an integrated semiconductor circuit as read out unit. the two units being connected together both electrically and mechanically, wherein the semiconductor body of the integrated circuit is covered at least partially by an insulating layer; a plurality of separate mosaic regions produced by poly-crystalline deposition and converted into mono-crystalline structure by means of high energy radiation are arranged directly on this insulating layer, said mosaic regions comprising IR-sensitive compound semiconductor materials; the individual mosaic regions include at least one pn-junction and that each mosaic region is connected to the read out unit in the integrated circuit in a manner which is electrically conductive.

According to a second aspect of the invention, there is provided a method of producing a semiconductor arrangement comprising applying an insulating layer to a semiconductor body containing an integrated circuit, applying a layer of an infra-red sensitive compound semiconductor material to said insulating layer, etching away part of said infra-red sensitive layer to form separate individual mosaic regions, introducing a pn-junction into said mosaic regions and electrically connecting said mosaic regions to said integrated circuit.

BRIEF DESCRIPTION OF THE DRAWINGS

The invention will now be described in greater detail, by way of example, with reference to the drawings, in which.

DESCRIPTION OF THE PREFERRED EMBODIMENTS

Figure 1:
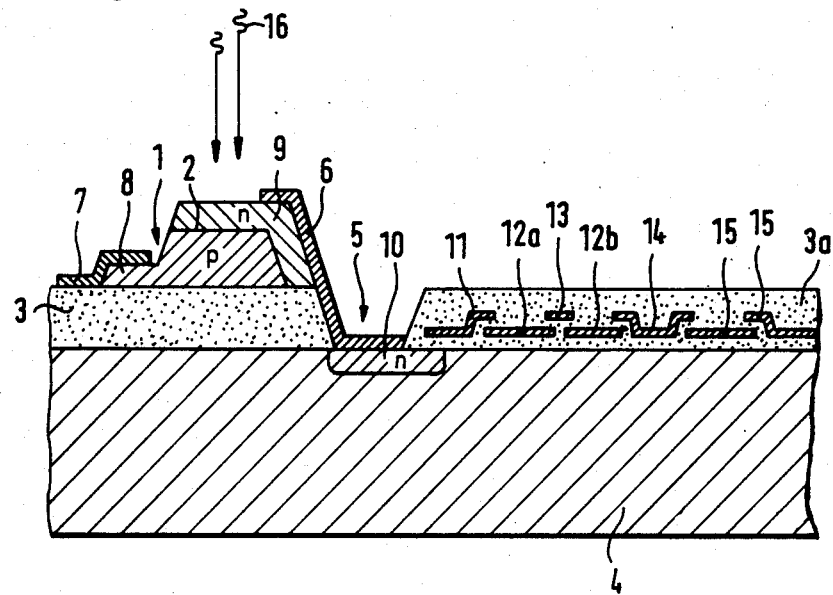
FIG. 1 is a part view, in section, of one embodiment of the invention.

In a preferred embodiment of the invention, in a semiconductor arrangement of the type stated at the outset the semiconductor body of the integrated circuit is covered at least partially with an insulating layer; a plurality of separate mosaic regions which are produced by poly-crystalline deposition and are converted by high energy radiation into mono-crystalline structure are arranged directly on this insulating layer, the mosaic regions comprising the IR-sensitive compound semiconductor material; the individual mosaic regions are provided with at least one pn-junction and each mosaic region is electrically connected to the readout unit in the integrated circuit.

An arrangement in which mono-crystalline PbS regions are arranged on Si has already been investigated: see "Direct in-jection readout of the p-n PbS-Si heterojunction detector", A. J. Steckl, K. Y. Tam, M. E. Montamedi, Appl. Phys. Lett. 35, 537 (1979). The detector material was separated or deposited in mono-crystalline form according to the hetero epitaxy process directly onto the silicon. However, if the deposited layer is intended to have the quality required for components, then the lattice structures and the lattice constants and the thermal expansion coefficients of the materials for the detector mosaic and the readout circuit have to be an exact match. This reduces the choice of suitable materials quite considerably.

With the semiconductor arrangement in accordance with the invention, the advantages of a proven material such as HgCdTe, which is preferred for the infra red detector, can be combined with those of mono-crystalline silicon material for the integrated readout circuit in an advantageous manner.

With other embodiments, the detector material may comprise InSb or $Pb_{1-x}Sn_xTe$. The semiconductor body of the integrated circuit also preferably comprises monocrystalline silicon. It preferably includes a complete readout unit with transfer structure, anti blooming device, background subtraction and charge shift registers produced according to conventional p- or n-channel MOS technology. This semiconductor body is covered with an insulating layer comprising silicon oxide or silicon nitride. The use of other metal oxides such as titanium oxide are also possible.

Separate islands or mosaic regions comprising monocrystalline IR-sensitive semiconductor material containing a diode structure in each case are located on the insulating layer of the silicon circuit. The two regions of each IR-sensitive diode are provided with a contact and each contact is connected to its individual readout structure in the integrated semiconductor circuit and then to the charge shift register in CCD technology. The other contact of each diode in each case is connected to a connection terminal common to all of the diodes, this connection terminal can be used to provide the operating potential prevailing at the pn-junction.

The semiconductor arrangement in accordance with the invention is preferably produced by applying a layer of IR-sensitive compound semiconductor material initially over the whole of the area and in poly-crystalline form to the insulating layer which covers the semiconductor body of the integrated circuit. This semiconductor layer is then subdivided into individual and separate mosaic regions by etching away the intermediate areas. The individual mosaic regions are then melted or rendered molten by means of a focused high energy beam so that these regions resolidify in mono-crystalline form as a result of the subsequent mono-crystalline layer growth. Finally, a pn-junction is introduced into the mosaic regions by diffusion or implantation of impurities.

When using HgCdTe as the IR-sensitive semiconductor material the initially poly-crystalline mosaic regions are preferably molten or melted by a laser beam, the energy of the laser beam being selected so that the mosaic region melts through its entire thickness while the insulating material thereunder and the silicon semiconductor body remain unaffected.

Referring now to the drawings, a part of a semiconductor arrangement in accordance with the invention is shown in FIG. 1 and this part includes an IR-sensitive mosaic region and a part of a possibly integrated readout circuit between two mosaic regions.

Figure 2:
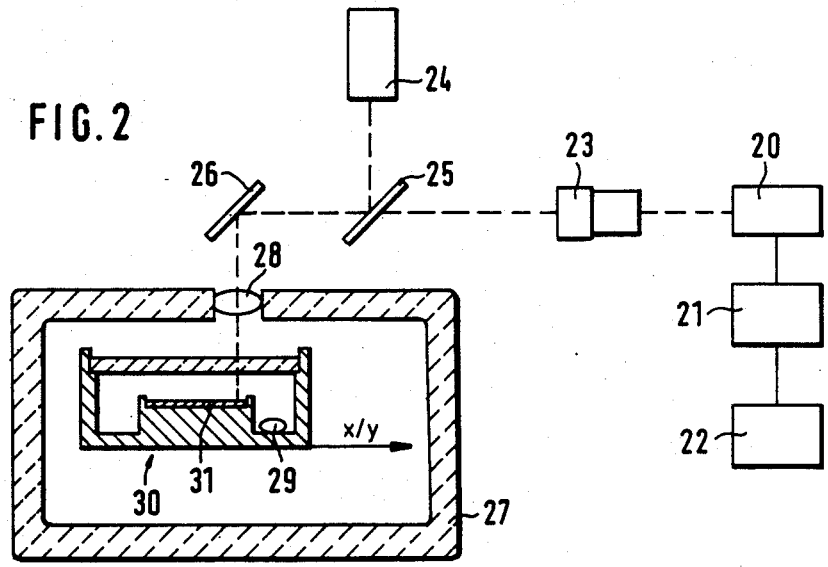
FIG. 2 is a diagram showing the use of a laser beam device in producing a semiconductor arrangement in accordance with the invention.

A laser beam device is shown in FIG. 2 and this is used to convert the initially poly-crystalline mosaic regions into mono-crystalline, IR-sensitive semiconductor regions.

The sectional view of FIG. 1 shows, as already mentioned, part of a semiconductor arrangement with an image recording unit and an integrated semiconductor circuit as the readout unit. One individual mosaic region 1 comprising IR-sensitive compound semiconductor material is shown and is located on an insulating layer 3 which in turn covers a silicon semiconductor body 4. The entire arrangement preferably comprises a plurality of IR-sensitive mosaic regions 1 which are formed like a matrix, the individual mosaic regions preferably having an area of between 25 $\mu$m$\times$25 $\mu$m and 80 $\mu$m$\times$80 $\mu$m. The matrix comprising IR-sensitive mosaic regions preferably includes at least 32$\times$32 individual elements.

The individual mosaic regions 1 include a pn-junction 2 which separates the n-conductive region 9 for example from the p-conductive region 8. The infra red light 16 hits the exposed surface of the n-conductive region 9 and releases a stimulation of the electrons in the compound semiconductor from the valance band into the conduction band. The p-conductive region 8 is provided with a connecting contact 7 which is preferably common to all of the mosaic regions and the barrier layer potential of the individual diodes can be adjusted by means of this connecting contact 7. A connecting contact 6 is applied to the n- conductive region 9 and is in electrically conductive connection with the integrated circuit, for example the semiconductor region 10, through openings 5 in the insulating layer 3. The sensitivity range of the IR-sensitive semiconductor material of the mosaic regions 1 is preferably in the wave length range of 3 to 5 $\mu$m or 8 to 12 $\mu$m. The mosaic regions 1 are preferably 2 to 8 $\mu$m thick.

In the field according to FIG. 1, the mosaic regions 1 of the IR-sensitive material are arranged on the insulating layer 3 over regions of the silicon semiconductor body 4 which do not include components of the integrated circuit nor connecting lines. Rather the components and connecting lines of the integrated cirucit are located in each case between the mosaic regions.

According to FIG. 1 these intermediate areas are also covered by an insulating layer 3a and numerous gate structures 11–15 are arranged in the insulating layer, serving to transfer the charge and transmit the charge according to the CCD technique. These gate structures may, for example, comprise poly-crystalline silicon, the poly-crystalline silicon in individual gates comprising two layers in between which the insulating material is located in areas in order to produce over-lapping between the individual gate structures.

Instead of the arrangement shown in FIG. 1, a further increase in density of the detector mosaic can be achieved, i.e. a reduction in the size of the semi conductor arrangement, by arranging the mosaic regions 1 on the insulating layer 3a over the regions of the silicon semi conductor body or the insulating layer, which include the components of the gate structures and connecting lines of the read out circuit. In this case all the connecting lines have to be placed in the oxide layer 3a with the aid of conventional multi-layer processes.

In the embodiment according to FIG. 1, the silicon base member comprises p-conductive material into which an n-conductive region 10 is inlaid. The charge carriers produced by absorption of IR-Quanta in the mosaic region 1 are transferred into this n-conductive region 10. This charge is transferred into the memory gate 12 with the aid of transfer gate 11. The integration time can be seat by means of the transfer gate 11.

The storage in memory gate 12 is sub-divided into areas 12a and 12b so that background subtraction is possible with the aid of the partition gate 13 which is arranged so as to overlap. Consequently, only the charge under the gate 12b is converted by the transfer gate 14 into the charge shift register with the gate 15. The signal obtained is then read out with the aid of the charge shift register.

The semiconductor arrangement shown in FIG. 1 is preferably made so that the regions and components required for the integrated circuit are introduced into the semiconductor base member 4 with the aid of planar techniques. The known 2-layer polysilicon technique is used for the gate structures present in the insulating layer 3a and the design structures are achieved with the aid of layer deposition and subsequent etching processes.

In the region in which, in accordance with FIG. 1, the mosaic regions 1 are arranged, the silicon base member 4 is preferably covered by an insulating layer 3 which is free of gate structures and connecting paths.

After providing the integrated semiconductor circuit, the whole of the surface of the insulating layer 3 or 3a respectively is covered by a layer comprising poly-crystalline HgCdTe material. This material may be deposited chemically from the gas phase in known manner or vapour deposited in an ultra high vacuum. In addition, it is possible to coat by means of cathode sputtering or to apply the layer in components. When applying layers in components, a layer of CdTe is applied first and then tempered in HgTe vapour in order to produce the HgCdTe material. It is also possible to apply an initial coating of HgTe and to temper this in a CdTe vapour.

Afterwards the mosaic regions according to FIG. 1 are etched out of the IR-sensitive semiconductor layer. A photo lacquer layer may be used as the etching mask. Besides chemical etching, ion etching can also be used very profitably. According to this method, the still poly-crystalline mosaic regions are converted into mono-crystalline regions by means of punctiform or continuous scanning radiation with a laser beam. A laser radiation device according to FIG. 2 is used for this.

In FIG. 2, a furnace 27 is shown in which a closed chamber 30 is arranged. This chamber 30 serves as a displaceable sample holder for the semiconductor disc 31 which comprises the silicon base member and IR-sensitive HgCdTe material. Furthermore, a Hg source 29 is housed in the chamber 30 and is used to produce the required mercury vapour pressure. A laser beam falls via a lens 28 onto the previously set area of the semiconductor disc or chip 31. The adjustment of the laser beam is effected by means of the adjustable laser 24, which scans the surface of the semiconductor arrangement by means of a semi permeable mirror 25 and the mirror 26. The laser beam initiating melting of the mosaic regions 1 in accordance with FIG. 1 passes from the laser unit 20 and is guided by means of the raster optics 23 and the mirror 25 and 26 onto the semiconductor arrangements. The laser beam is pulsed by means of a unit 21 which is supplied with current by a unit 22.

The method of converting poly-crystalline IR-sensitive mosaic regions into mono-crystalline form will be dealt with in more detail below:

It is known that, by radiation with a source of radiation of sufficient energy, an amorphous or poly-crystalline layer can be transferred into the mono-crystalline state. The amorphous or poly-crystalline layer is transitorily melted in its entire depth but only in precisely defined small areas. If the layer underneath is crystalline then the boundary area will be subject to epitaxial layer growth as solidification takes place. This is described for example in "Spatially Controlled Crystal Regrowth of Ion Implanted Silicon by Laser Irradiation", G. K. Cellar, M. M. Poate and L. C. Kimerling, Appl. Phys. Lett. 32, 111 (1978). If the layer underneath is amorphous then there is mono-crystalline layer growth which starts from the area first crystallised in the form of a seed or germ. This is described for example in "Properties of Patterned and CS-Laser-Crystallised Silicon Films on Amorphous Substrates", N. M. Johnson, D. K Biegelsen and H. D. Moyer, Proceedings INFOS-conference, Erlangen (1981).

The method in accordance with the invention makes use of the latter property and uses it on the infra red sensitive material $Hg_{1-x}Cd_xTe$. The fundamental significance is that both the process steps for producing the detector and the output data are independent of the crystal orientation. Therefore it is not necessary to give the seed of crystallization a preferred orientation. However two special peculiarities should be noted:

$Hg_{1-x}Cd_xTe$ breaks down at elevated temperatures in a vacuum so that the element Hg may vapourise out of the surface. This is avoided by carrying out melting and solidification in a Hg vapour atmosphere.

In addition solidifying $Hg_{1-x}Cd_xTe$ breaks down as follows:

Initially the component CdTe is crystallised and the remainder of the melt is enriched with HgTe in the solidification front. As a result the component which was last crystallised out of the region melted by the laser beam is richer than HgTe than the component which was crystallised first. As a result of using the method in accordance with the invention the inhomogeneity remains limited to microscopic regions respectively and can be compensated by subsequent tempering operations.

When the mosaic structure has similar elements (for example $25 \times 25$ $\mu m^2$) the molten surface may cover a whole element. In larger elements (e.g. $80 \times 80$ $\mu m^2$) the re-crystallisation is carried out in parts of an element as follows:

The regions melted by successive laser radiation pulses overlap. The subsequent tempering treatment at temperatures of 400–600 degrees C., also in a Hg vapour atmosphere is suitable in both cases to bring about homogenisation by diffusion of Hg and Cd. At the same time, the optimum hole concentration for photo voltaic detectors of $p = 10^{15}$ to $10^{16} cm^{-3}$ for the p-conductive detector base material is provided. If the detector base material is n-conductive, then a tempering treatment follows of 200-300 degrees C. in an Hg vapour atmosphere which produces an electron concentration of between $n = 10^{15}$ and $10^{16} cm^{-3}$. The pn-junction is provided by diffusion or implantation respectively of suitable ions of opposite donar characteristics.

Mercury or aluminium are preferably diffused into the HgCdTe material in order to produce a n-conductive semi-conductive region. Boron, mercury or beryllium are suitable for implantation. A p-conductive region is preferably produced by implanting phosphorus or silver atoms into the previously n-conductive material. Thereafter the n- and p-conductive regions of the IR-sensitive material are provided with connecting contacts. This process of contacting can be carried out at the same time as providing contact for the integrated circuit. Multi layer structures comprising chromium-indium or chromium/gold are suitable as contact materials.

It will be understood that the above description of the present invention is susceptible to various modifications changes and adaptations.

What is claimed is:

1. A method of producing a semiconductor arrangement including an image recording unit composed of a plurality of mutually separated mosaic regions formed of a monocrystalline infrared sensitive compound semiconductor material, and each including at least one pn-junction, disposed on the surface of an insulating layer which at least partially covers the surface of a semiconductor body containing an integrated circuit which functions as a read out unit for said image recording unit, said method comprising: initially applying a layer of IR-sensitive compound semiconductor material in polycrystalline form over the entire area of said insulating layer covering said semiconductor body of said integrated circuit; subsequently dividing said semiconductor layer into separate individual said mosaic regions by etching away the intermediate areas; converting the individual polycrystalline mosaic regions to mono-crystalline mosaic regions by melting the individual mosaic regions by means of a focused high energy beam and then permitting these melted regions to resolidify in mono-crystalline form because of the subsequent mono-crystalline growth of the layer; and finally, introducing a pn-junction into said mono-crystalline mosaic regions by diffusion or implantation of impurities.

2. A method as defined in claim 1, wherein said IR-sensitive semi-conductor material comprises $Hg_{1-x}Cd_xTe$.

3. A method as defined in claim 1, wherein said IR-sensitive semiconductor material comprises InSb.

4. A method as defined in claim 1, wherein said IR-sensitive semiconductor material comprises $Pb_{1-x}Sn_xTe$.

5. A method as defined in claim 1, wherein the sensitive region of said IR-sensitive semiconductor material is in the wavelength range: 3 to 5 $\mu m$.

6. A method as defined in claim 1, wherein the sensitive region of said IR-sensitive semiconductor material is in the wavelength range: 8 to 12 $\mu m$.

7. A method as defined in claim 1, wherein said semiconductor body comprises mono-crystalline silicon; and said insulating layer comprises any one of the group consisting of silicon oxide ($SiO_x$), titanium oxide ($TiO_x$) and silicon nitride ($Si_3N_4$); and, further comprising electrically connecting said mosaic regions of IR-sensitive material to said integrated circuit via conductor paths extending through openings in said insulating layer.

8. A method as defined in claim 1, wherein said mosaic regions comprising an IR-sensitive material are approximately 2 to 8 $\mu m$ in thickness.

9. A method as defined in claim 1, wherein said polycrystalline mosaic regions of said IR-sensitive compound semiconductor material comprise $Hg_{1-x}Cd_xTe$ and are melted by irradiation with a laser beam, with the energy produced by said laser beam being selected to melt the mosaic regions all the way through while the insulating material thereunder and the silicon semiconductor body are unaffected.

10. A method as defined in claim 1, wherein the melting is carried out by a pulsed laser beam.

11. A method as defined in claim 1, further comprising tempering the semiconductor arrangement after mono-crystalline resolidification of said mosaic regions, with the tempering atmosphere and the tempering duration being selected to compensate for the inhomogeneity of the composition of the IR-sensitive material which remains after resolidification.

12. A method as defined in claim 1, wherein the semiconductor arrangement is subjected to a tempering process in which the atmosphere, the duration and temperature are selected to provide a concentration of charge carriers in said mosaic regions suitable for use as a detector.

13. A method as defined in claim 9, wherein the diameter of the laser beam is selected to cover one mosaic region in each case over its entire area.

14. A method as defined in claim 9, wherein the diameter of the laser beam is selected to cover only half of the area of a mosaic region, and each mosaic region is melted by a number of off-set laser beam pulses with the areas covered by successive laser beam pulses overlapping.

15. A method as defined in claim 9 wherein said irradiation by said laser is implemented in an atmosphere which prevents the breakdown of the HgCdTe material during the time when the laser beam is applied.

16. A method as defined in claim 12, wherein a common tempering process is implemented in order to eliminate inhomogeneity and set the charge carrier concentration.

17. A method as defined in claim 11, wherein with an IR-sensitive material comprising HgCdTe, said tempering is implemented in a Hg-vapour at 400-600 degrees C. and for a period of more than 24 hours.

18. A method as defined in claim 15, wherein said ir-radiation by laser is implemented in a Hg-vapour atmosphere.

19. In a method for producing a semiconductor arrangement including an image recording unit composed of a plurality of mutually separated mosaic regions of infrared sensitive compound semiconductor material disposed on an integrated silicon semiconductor circuit which functions as the read-out unit, with each mosaic region having at least one pn-junction, with the image recording unit composed of the mosaic regions being electrically and mechanically coupled with the read-out unit, and with an insulating layer being disposed between the mosaic regions and the silicon semiconductor circuit, the improvement wherein: said mosaic regions are produced on said insulating layer by precipiting a layer of polycrystalline compound semiconductor material directly onto the surface of said insulating layer, and subsequently converting said layer of polycrystalline semiconductor material into mono-crystalline semiconductor regions by means of high energy radiation.

20. A method of producing a semiconductor device including an image recording unit composed of an array of a plurality of separated detector mosaic regions of infrared sensitive monocrystalline compound semiconductor material disposed on an integrated silicon semiconductor CCD circuit which functions as a read-out unit, said method comprising the steps of providing a Si-CCD suitable for IR-detector signal read-out of an image recording unit;

depositing an insulating layer of the desired composition and thickness over a surface of said Si-CCD;

depositing a polycrystalline layer of a compound semiconductor material, which in its monocrystalline state forms an infrared detector material, onto said insulating layer; etching said layer of polycrystalline material to divide same into separate mosaic regions corresponding to the desired detector array structure; recrystallizing said polycrystalline mosaic regions to monocrystalline form by irradiation with light of the desired energy and power while applying a vapor pressure of inert gas or of the more volatile components of the material being recrystallized;

thereafter annealing the complete device under conditions which permit homogenization of the recrystallized material and desired electrical properties thereof;

thereafter forming a pn-junction in each of the detector mosaic regions; and interconnecting the detector mosaic regions with the input structures of the Si-CCD by deposited metal conductors extending through openings in said insulating layer.

* * * * *